(12) United States Patent
Zhang et al.

(10) Patent No.: US 9,159,617 B2
(45) Date of Patent: Oct. 13, 2015

(54) STRUCTURE AND METHOD OF FORMING SILICIDE ON FINS

(71) Applicant: GLOBALFOUNDRIES Inc., Grand Cayman, KY (US)

(72) Inventors: Xunyuan Zhang, Albany, NY (US); Xiuyu Cai, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 16 days.

(21) Appl. No.: 14/162,841

(22) Filed: Jan. 24, 2014

(65) Prior Publication Data

US 2015/0214105 A1  Jul. 30, 2015

(51) Int. Cl.
*H01L 21/20* (2006.01)
*H01L 21/768* (2006.01)
*H01L 21/02* (2006.01)
*H01L 29/66* (2006.01)
*H01L 23/532* (2006.01)

(52) U.S. Cl.
CPC .... *H01L 21/76886* (2013.01); *H01L 21/02634* (2013.01); *H01L 23/53209* (2013.01); *H01L 29/66795* (2013.01)

(58) Field of Classification Search
CPC ................... H01L 2224/0231; H01L 23/5239; H01L 24/11
USPC .......................... 438/481, 630, 649, 655, 682
See application file for complete search history.

(56) References Cited

U.S. PATENT DOCUMENTS

| | | | |
|---|---|---|---|
| 7,442,596 B2 * | 10/2008 | Lee et al. | 438/198 |
| 7,985,669 B2 | 7/2011 | Huotari et al. | |
| 8,021,918 B2 * | 9/2011 | Lin et al. | 438/106 |
| 8,377,767 B2 * | 2/2013 | Grupp et al. | 438/167 |
| 8,686,516 B2 | 4/2014 | Chen et al. | |
| 2013/0062669 A1 * | 3/2013 | Chen et al. | 257/288 |
| 2013/0161744 A1 | 6/2013 | Basker et al. | |

* cited by examiner

*Primary Examiner* — S. V. Clark
(74) *Attorney, Agent, or Firm* — Williams Morgan, P.C.

(57) ABSTRACT

Embodiments of the invention provide a semiconductor structure and a method of forming a semiconductor structure. Embodiments of the semiconductor structure have a plurality of fins on a substrate. The semiconductor has, and the method achieves, a silicide layer formed on and substantially surrounding at least one epitaxial region formed on a top portion of the plurality of fins. Embodiments of the present invention provide a method and structure for forming a conformal silicide layer on the epitaxial regions that are formed on the top portion of unmerged fins of a finFET.

16 Claims, 11 Drawing Sheets

STRUCTURE AND METHOD OF FORMING SILICIDE ON FINS

FIELD OF THE INVENTION

The present invention relates generally to semiconductor fabrication, and more particularly, to a structure and method for forming silicide on semiconductor fins.

BACKGROUND

As integrated circuits continue to scale downward in size, the finFET (fin field effect transistor) is becoming attractive for use with modern semiconductor devices. In a finFET, the channel is formed by a semiconductor vertical fin (as compared with a planar channel in a conventional CMOS), and a gate electrode is located and wrapped around the vertical fin. Creating a contact with the fin having the proper density is of serious concern for device operation. Reducing contact resistance is critical to improvement of speed of device operation. It is therefore desirable to have improved methods and structures to improve finFET performance.

SUMMARY

In one aspect, embodiments of the present invention provide a method of forming a semiconductor structure, having the steps of: forming a plurality of silicon fins on a silicon substrate; depositing a high-K dielectric layer on the silicon substrate adjacent to each fin of the plurality of fins; forming at least one epitaxially grown silicon region on an upper portion of each fin of the plurality of fins, wherein the plurality of fins are unmerged; depositing a seed metal layer on the high-K dielectric layer; depositing an interspacing fill metal on the seed metal layer and on the at least one epitaxially grown silicon region; and forming a silicide of the interspacing fill metal on the at least one epitaxially grown silicon regions.

In another aspect, embodiments of the present invention provide a method of forming a semiconductor structure, having the steps of: forming a plurality of silicon fins on a silicon substrate; depositing a high-K dielectric layer on the substrate adjacent to each fin of the plurality of fins; forming at least one epitaxially grown silicon region on an upper portion of each fin of the plurality of fins, wherein the plurality of fins are unmerged; forming a metal gate on the silicon substrate; depositing a seed metal layer on the high-K dielectric layer; depositing an interspacing fill metal on the seed metal layer; depositing a metal layer comprised of the interspacing fill metal on the at least one epitaxially grown silicon region; and forming a silicide of the interspacing fill metal on the at least one epitaxially grown silicon region.

In yet another aspect, embodiments of the present invention provide a semiconductor structure, having a silicon substrate; a plurality of silicon fins formed in the silicon substrate; an epitaxial region formed on a top portion of each of the plurality of fins, wherein the plurality of fins are unmerged; and a silicide layer formed on, and substantially surrounding, each epitaxial region.

BRIEF DESCRIPTION OF THE DRAWINGS

The accompanying drawings, which are incorporated in and constitute a part of this specification, illustrate several embodiments of the present teachings and together with the description, serve to explain the principles of the present teachings.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity. Furthermore, for clarity, some reference numbers may be omitted in certain drawings.

DETAILED DESCRIPTION

Figure 1:
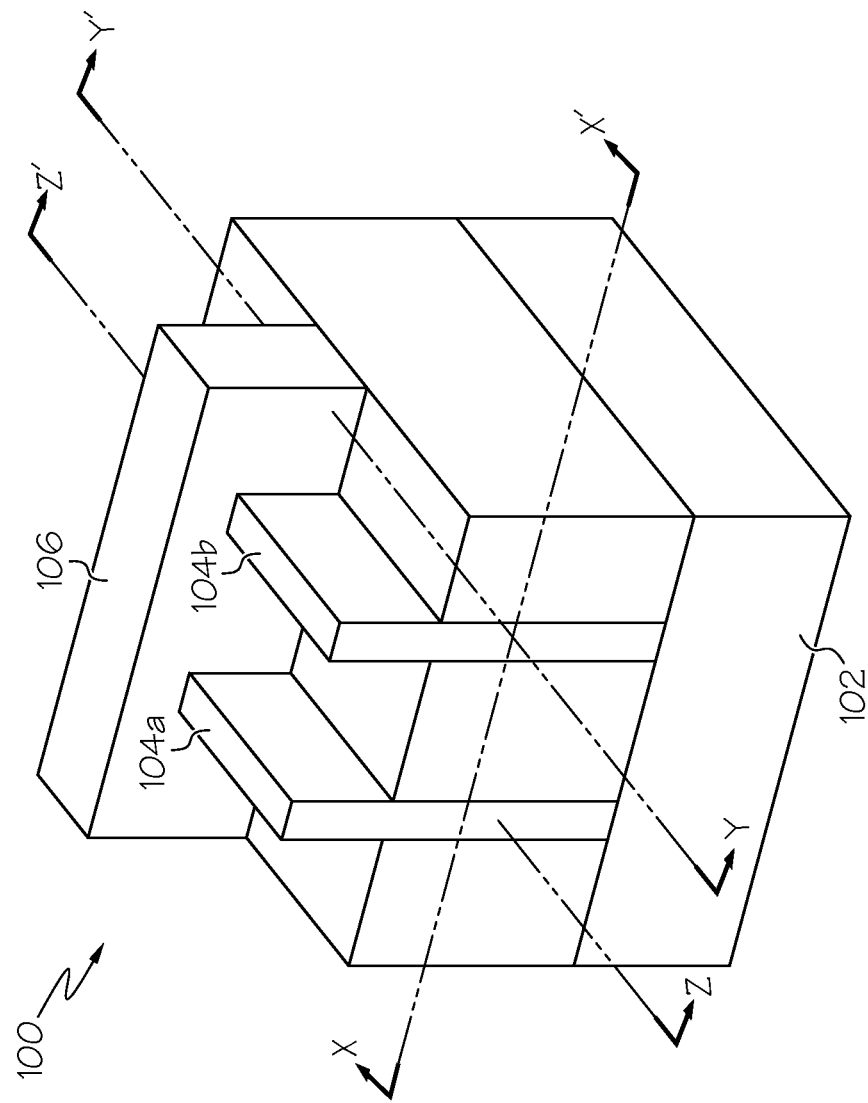
FIG. 1 is a perspective view of a semiconductor structure at a starting point for embodiments of the present invention.

Illustrative embodiments will now be described more fully herein with reference to the accompanying drawings, in which embodiments are shown. This disclosure may, however, be embodied in many different forms and should not be construed as limited to the embodiments set forth herein. Rather, these embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The term "set" is intended to mean a quantity of at least one. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," "some embodiments," or similar language means that a particular feature, structure, or characteristic described in connection with the embodiment is included in at least one embodiment of the present invention. Thus, appearances of the phrases "in one embodiment," "in an embodiment," "in embodiments", "in some embodiments," and similar language throughout this specification may, but do not necessarily, all refer to the same embodiment.

The terms "overlying" or "atop", "positioned on, "positioned atop", or "disposed on", "underlying", "beneath" or "below" mean that a first element, such as a first structure (e.g., a first layer) is present on a second element, such as a second structure (e.g. a second layer) wherein intervening elements, such as an interface structure (e.g. interface layer) may be present between the first element and the second element.

Embodiments of the present invention provide an improved method of finFET fabrication and corresponding structure. There are various applications where it is desirable to have unmerged fins (fins that are not joined together by an epitaxial region), for example in SRAM applications. Proper contact formation is important to reduce resistance and improve device operation speed. Epitaxial regions are formed on the upper portion of fins to provide a larger contact surface. However, prior art processes cannot form a good conformal silicide on the epitaxial regions of unmerged fins. Embodiments of the present invention provide a method and structure for forming a conformal silicide layer on the epitaxial regions that are formed on the top portion of unmerged fins of a finFET.

FIG. 1 is a perspective view of an example fin type field effect transistor (finFET) semiconductor structure 100. The semiconductor structure 100 comprises a silicon substrate 102 having thereon fins 104a and 104b, which are formed from an SOI layer. Further shown is a gate 106. It should be recognized that although two fins and one gate is shown, in some embodiments, more or fewer fins per transistor may be present. In some embodiments, the plurality of fins each have a pitch ranging from about 20 nanometers (nm) to about 60 nm. In some embodiments, the fins each have a thickness ranging from about 5 nm to about 20 nm. It should be recognized that the pitch range and thickness range are examples, and any suitable pitch or thickness is included within the scope of the invention.

Figure 2:
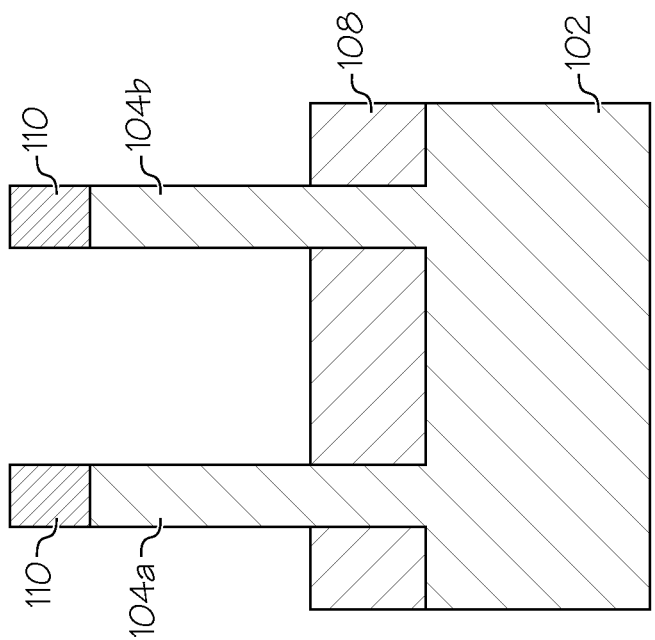
FIG. 2 is a semiconductor structure as viewed along line X-X' of FIG. 1, after subsequent processing steps of forming a first oxide layer.

FIG. 2 is a semiconductor structure as viewed along line X-X' of FIG. 1, after subsequent processing steps of forming a first silicon oxide layer 108 over the silicon substrate. To form the structure, a hard mask of silicon nitride is deposited on the substrate, and fins then formed using industry standard techniques, such as sidewall image transfer (SIT), resulting in the fins 102a, 102b with a hard mask layer 110 disposed over each fin.

Figure 3:
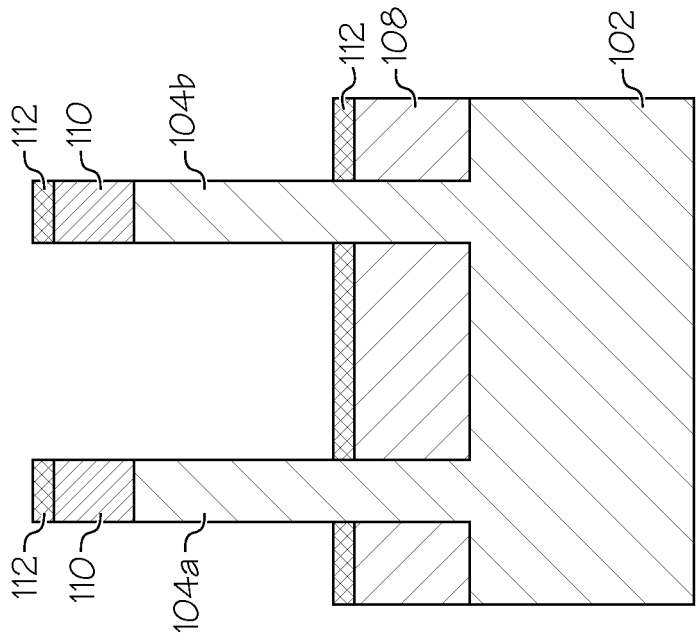
FIG. 3 is a semiconductor structure as viewed along line X-X' of FIG. 1, after subsequent processing steps of forming a high-K dielectric layer.

FIG. 3 is a semiconductor structure as viewed along line X-X' of FIG. 1, after subsequent processing steps of forming a high-K dielectric layer 112 over the first silicon oxide layer 108 and the silicon nitride hard mask layer 110 over the fins 102a and 102b. In some embodiments, the high-K dielectric layer 112 is hafnium oxide (HfO2). In some embodiments, the high-K layer is zirconium dioxide (ZrO2). In some embodiments, the high-K dielectric layer 112 is deposited by a horizontal deposition process, such as physical vapor deposition. With a horizontal deposition process, the high-K dielectric layer 112 deposits on horizontal surfaces adjacent to fins 104a and 104b, but does not substantially deposit on the sides of the fins 104a and 104b.

Figure 4:
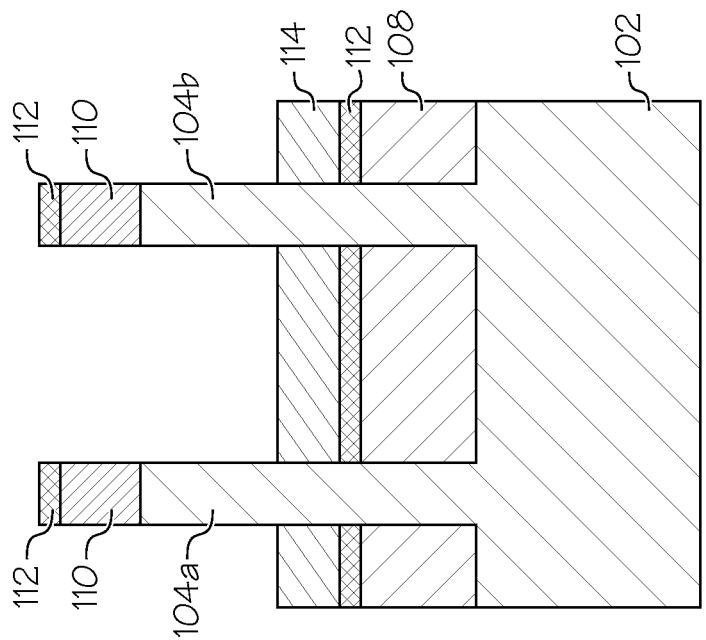
FIG. 4 is a semiconductor structure as viewed along line X-X' of FIG. 1, after subsequent processing steps of forming a second oxide layer.

FIG. 4 is a semiconductor structure as viewed along line X-X' of FIG. 1, after subsequent processing steps of forming a second silicon oxide layer 114 over the high-K dielectric layer 112. In some embodiments, the second silicon oxide layer is deposited via a chemical vapor deposition process, and then planarized (e.g. via a chemical mechanical polish process), followed by a recess, such as a chemical oxide removal (COR) process.

Figure 5:
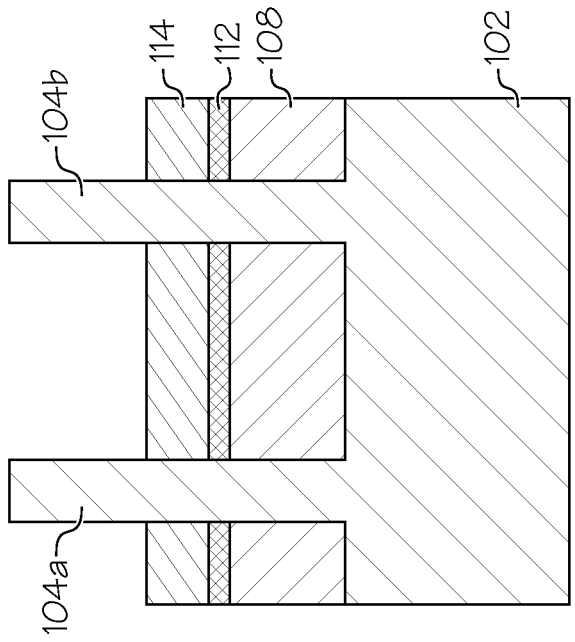
FIG. 5 is a semiconductor structure as viewed along line X-X' of FIG. 1, after subsequent processing steps of removing various layers.

FIG. 5 is a semiconductor structure as viewed along line X-X' of FIG. 1, after subsequent processing steps of removing various layers. In some embodiments, the high-K dielectric layer 112 and the hard mask 110 are removed from over the fins 102a and 102b.

Figure 6:
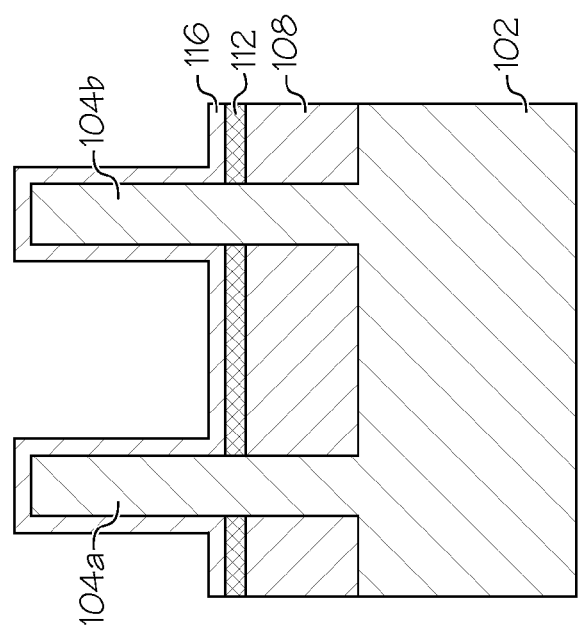
FIG. 6 is a semiconductor structure as viewed along line X-X' of FIG. 1, after subsequent processing steps of depositing a conformal oxide layer.

FIG. 6 is a semiconductor structure as viewed along line X-X' of FIG. 1, after a subsequent processing step of removing the second silicon oxide layer 114 (FIG. 5) and then depositing a conformal oxide layer 116 over the fins 102a and 102b and the high-K dielectric layer 112. In some embodiments, the deposition is performed by a chemical vapor deposition process.

Figure 7:
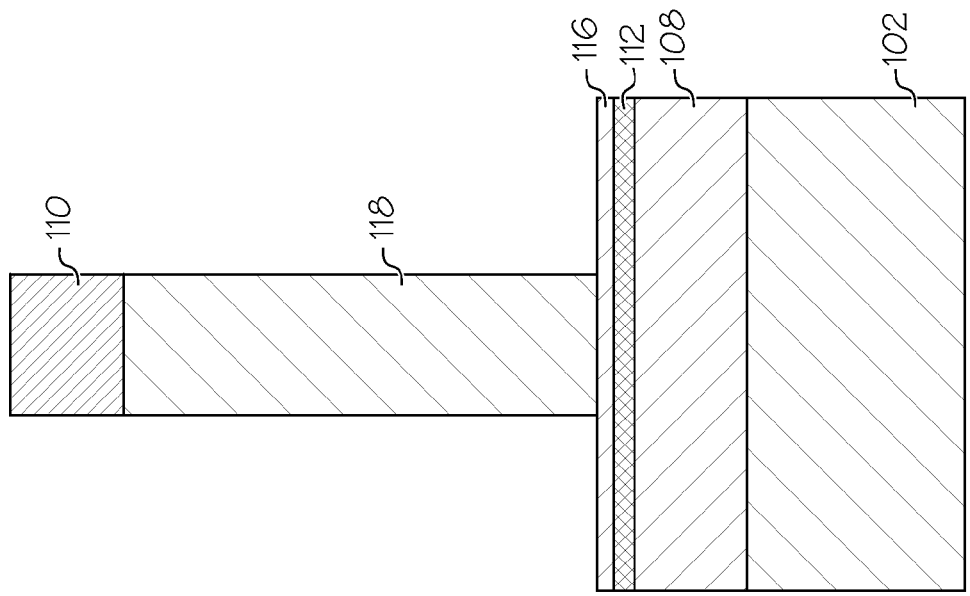
FIG. 7 is a semiconductor structure as viewed along line Y-Y' of FIG. 1, after subsequent processing steps of forming a dummy polysilicon gate.

FIG. 7 is a semiconductor structure as viewed through the gate, along line Y-Y' of FIG. 1, after subsequent processing steps of depositing a polysilicon material and patterning it to form gate 118. In some embodiments, the gate 118 is formed by etching using a reactive ion etch process. It should be recognized that any suitable etch may be substituted without departing from the scope of the invention. The gate 118 may be a dummy gate that is later removed as part of a replacement metal gate (RMG) process.

Figure 8:
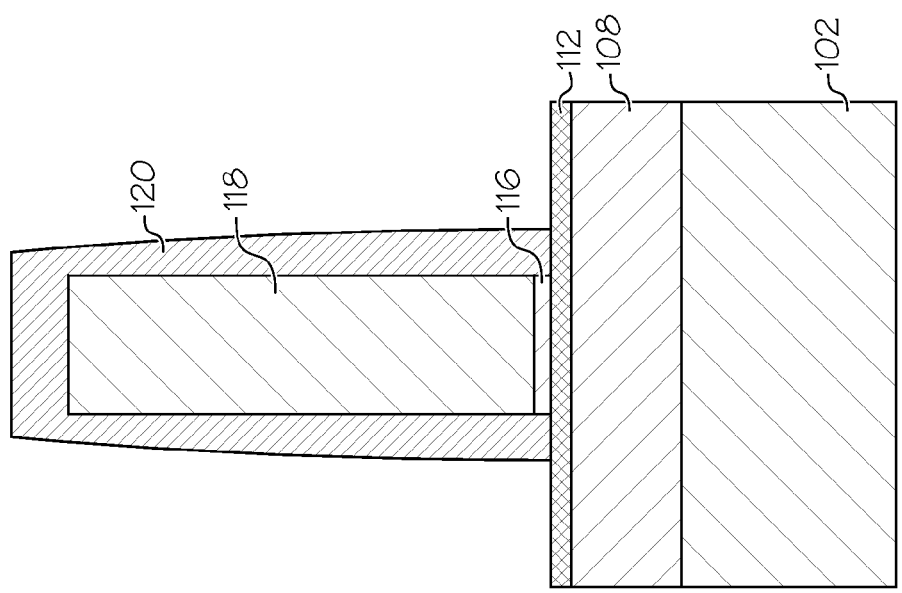
FIG. 8 is a semiconductor structure as viewed along line Y-Y' of FIG. 1, after subsequent processing steps of forming a silicon nitride spacer.

FIG. 8 is a semiconductor structure as viewed along line Y-Y' of FIG. 1, after subsequent processing steps of forming an additional silicon nitride layer 120 around the dummy polysilicon 118. In some embodiments, the polysilicon layer 118 is deposited by photoresist. In some embodiments, the silicon nitride layer 120 functions as a spacer.

Figure 9:
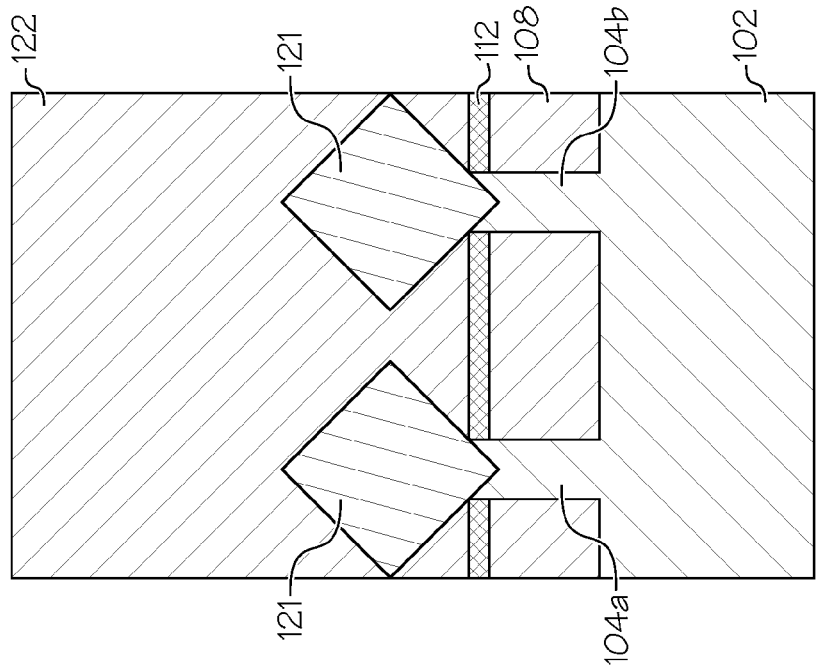
FIG. 9 is a semiconductor structure as viewed along line X-X' of FIG. 1, after subsequent processing steps of depositing an inter-layer dielectric (ILD).

FIG. 9 is a semiconductor structure as viewed along line X-X' of FIG. 1, after subsequent processing steps of forming diamond-shaped epitaxial regions 121, followed by depositing an inter-layer dielectric (ILD) 122. In some embodiments, the ILD 122 comprises silicon oxide. In some embodiments, the ILD 122 is deposited by a chemical vapor deposition process. Industry standard processes may be used to grow the substantially-diamond shaped epitaxial regions 121 over a top portion of fins 104a, 104b. The epitaxial regions 121 are formed in a substantially-diamond shape due to the crystal planes of the silicon.

Figure 10:
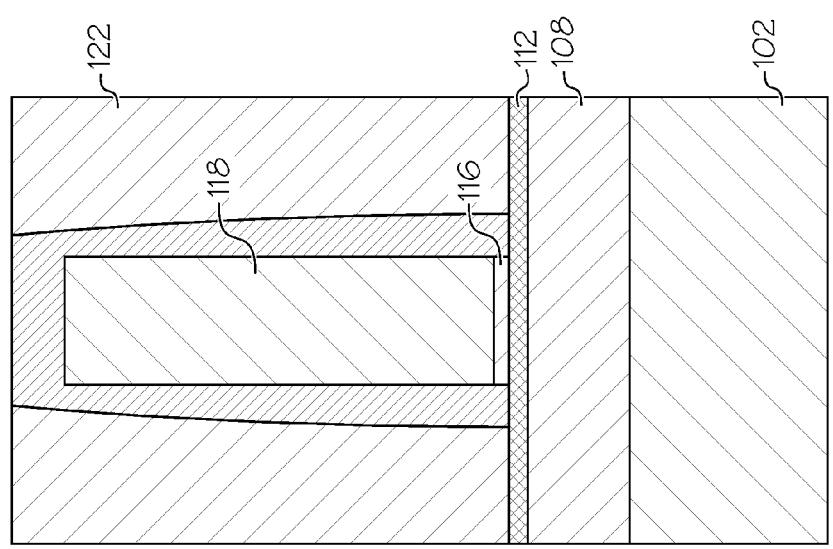
FIG. 10 is a semiconductor structure as viewed along line Y-Y' of FIG. 1, after subsequent processing steps of by oxide chemical mechanical planarization stopping on nitride.

FIG. 10 is a semiconductor structure as viewed along line Y-Y' of FIG. 1, after the subsequent processing steps of depositing an inter-layer dielectric 122, as discussed with respect to FIG. 9.

Figure 11:
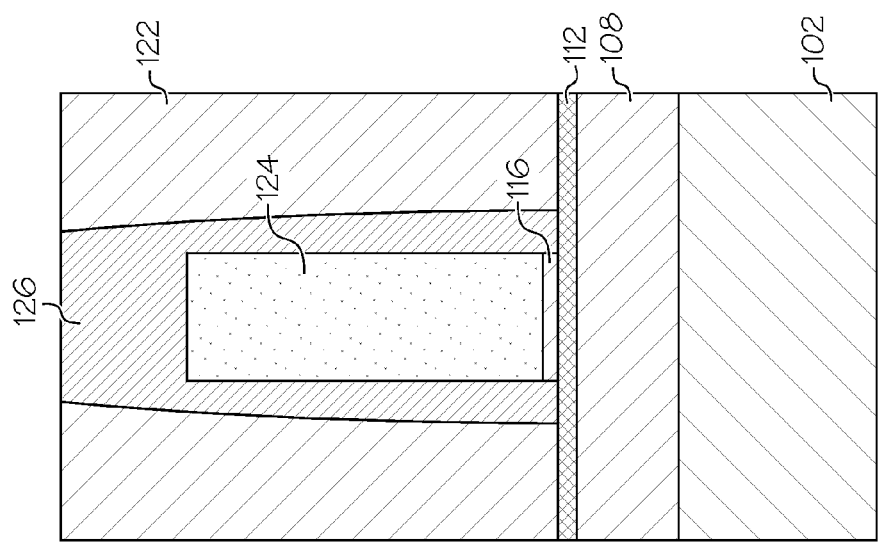
FIG. 11 is a semiconductor structure as viewed along line Y-Y' of FIG. 1, after subsequent processing steps of removing the dummy polysilicon, forming a replacement metal gate, and forming a nitride cap.

FIG. 11 is a semiconductor structure as viewed along line Y-Y' of FIG. 1, after subsequent processing steps of removing the dummy polysilicon 118, forming a replacement metal gate 124, and forming a nitride cap 126 in accordance with standard replacement metal gate (RMG) processes. Note that replacement metal gate 124 may further include additional films and layers, including additional gate oxide layers and/or additional metal layers (not shown), such as work function metal layers in accordance with industry standard techniques.

Figure 12:
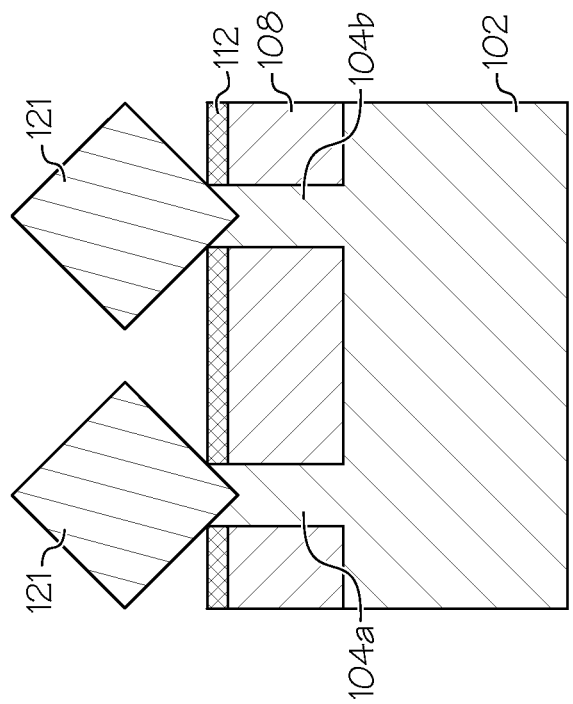
FIG. 12 is a semiconductor structure as viewed along line X-X' of FIG. 1, after subsequent processing steps of removing the ILD.

FIG. 12 is a semiconductor structure as viewed along line X-X' of FIG. 1, after a subsequent processing step of removing the inter-layer dielectric 122. In embodiments, this is done by a selective etch process.

Figure 13:
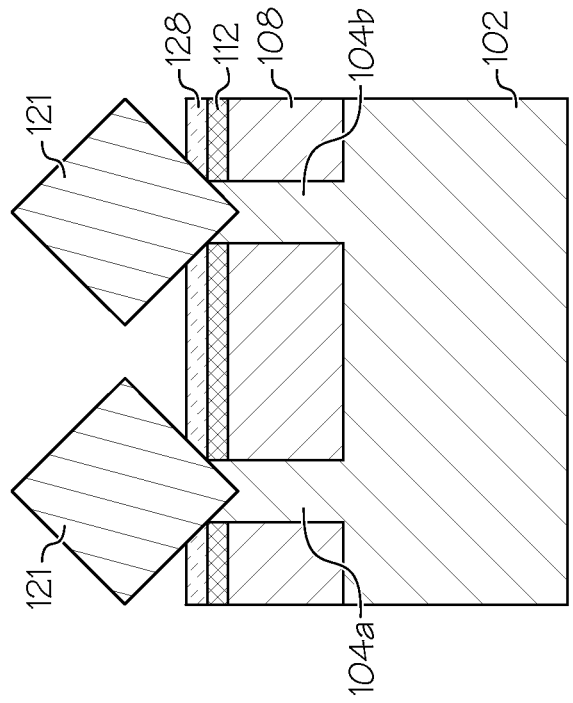
FIG. 13 is a semiconductor structure as viewed along line X-X' of FIG. 1, after subsequent processing steps of selectively growing a noble metal on a high-k metal oxide seed layer.

FIG. 13 is a semiconductor structure as viewed along line X-X' of FIG. 1, after subsequent processing steps of selectively growing a noble metal seed layer 128 over the high-K layer. In embodiments, the noble metal seed layer 128 comprises platinum. In embodiments, the noble metal seed layer 128 comprises ruthenium. In embodiments, the noble metal seed layer 128 comprises gold. In some embodiments, the noble metal seed layer 128 may be deposited by a selective deposition process, such as atomic layer deposition or chemical vapor deposition.

Figure 14:
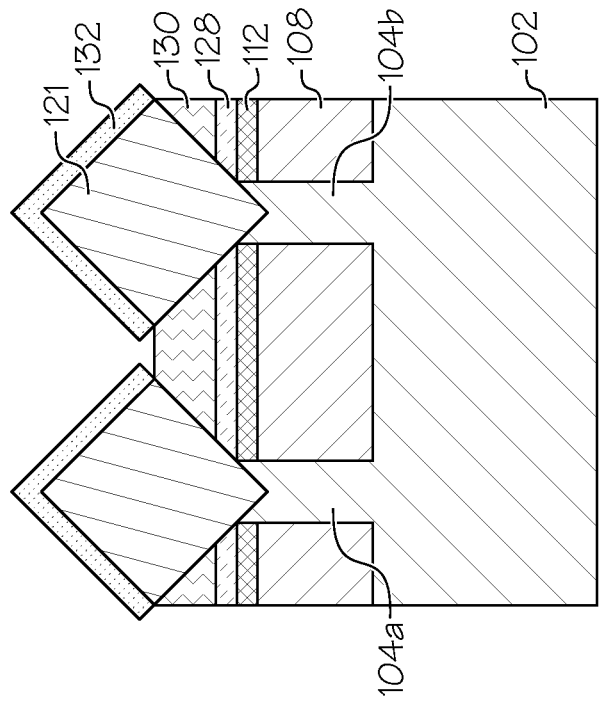
FIG. 14 is a semiconductor structure as viewed along line X-X' of FIG. 1, after subsequent processing steps of selectively growing an additional metal on the seed layer.

FIG. 14 is a semiconductor structure as viewed along line X-X' of FIG. 1, after subsequent processing steps of selectively depositing a first metal layer 130 over the seed layer to fill space beneath epitaxial regions 121 to a thickness B, which is approximately to the level of the side corners 129 (e.g. the level of maximum width) of the epitaxial regions 121. In some embodiments, the thickness B ranges from about 5 nanometers to about 15 nanometers. Thus, the first metal layer 130 serves as a lower interspacing fill metal for the epitaxial regions 121. In some embodiments, the first metal layer is deposited by chemical vapor deposition. In some embodiments, the first metal layer 130 comprises nickel. In some embodiments, the first metal layer 130 comprises tungsten. In some embodiments, the first metal layer 130 comprises aluminum. In some embodiments, the first metal layer 130 comprises titanium.

Figure 15:
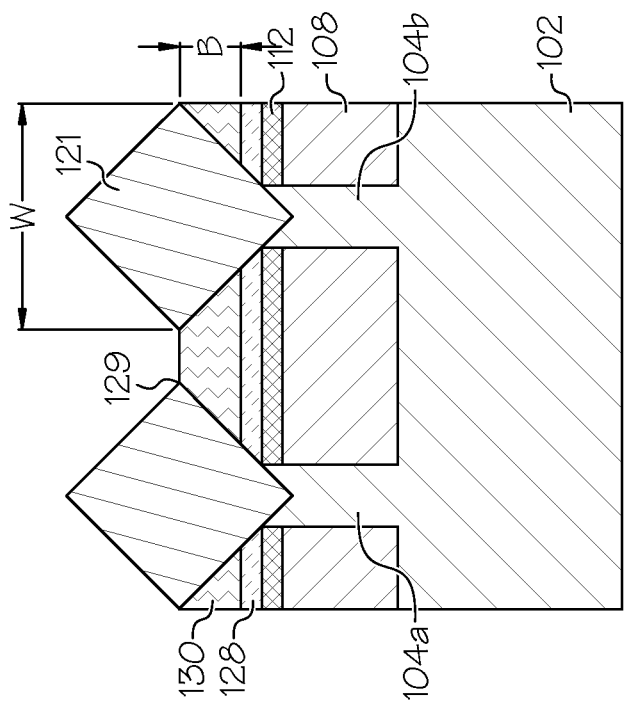
FIG. 15 is a semiconductor structure as viewed along line X-X' of FIG. 1, after subsequent processing steps of performing a metal deposition process.

FIG. 15 is a semiconductor structure as viewed along line X-X' of FIG. 1, after subsequent processing steps of a deposition of a second metal layer 132 over the epitaxial regions 121. In some embodiments, the second metal layer 132 comprises at least one of nickel or platinum. In embodiments, the second metal layer 132 may be formed of the same material as metal layer 130. In some embodiments, the second metal layer 132 may be formed from a different material as metal layer 130. In some embodiments, the deposition is performed by physical vapor deposition.

Figure 16:
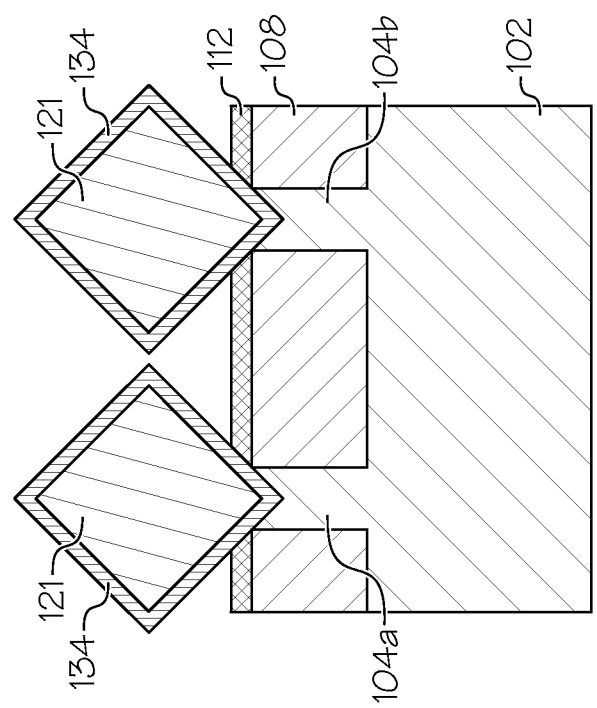
FIG. 16 is a semiconductor structure as viewed along line X-X' of FIG. 1, after subsequent processing steps of annealing to form silicide.

FIG. 16 is a semiconductor structure as viewed along line X-X' of FIG. 1, after subsequent processing steps of annealing the structure to form silicide regions 134, and, optionally, then removing a portion of at least one of the noble metal seed layer 128 and the first metal layer 130. In some embodiments, the annealing is performed at approximately 400-600 degrees Celsius for a duration of approximately 5 to 60 seconds. The metal layers (128 and 130 of FIG. 14) are removed from the structure, leaving a silicide layer 134 formed on the surfaces of the epitaxial regions 121. In some embodiments, the removing may be done by an etching process using aqua regia (nitro-hydrochloric acid). In some embodiments, the silicide is nickel silicide. As a result of this process, the silicide regions 134 formed on, and substantially surrounding, each epitaxial region 121.

Figure 17:
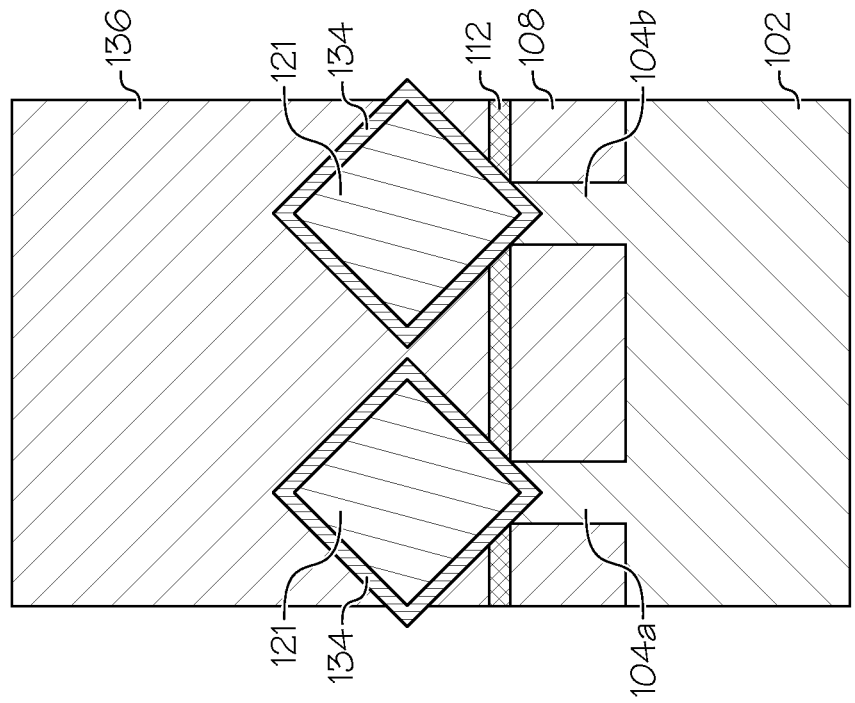
FIG. 17 is a semiconductor structure as viewed along line X-X' of FIG. 1, after subsequent processing steps of depositing a second layer of ILD.
Figure 19:
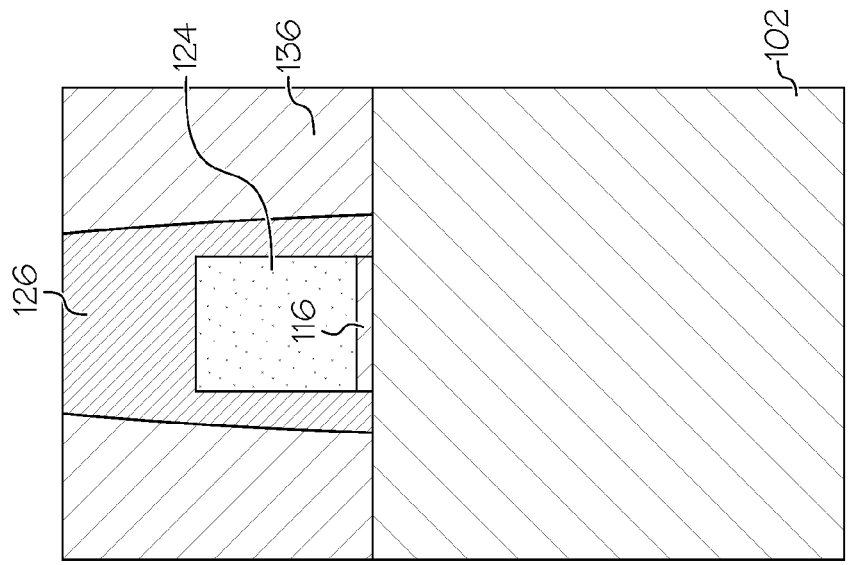
FIG. 19 is a semiconductor structure as viewed along line Z-Z' of FIG. 1, after subsequent processing steps of depositing a second layer of ILD.
Figure 18:
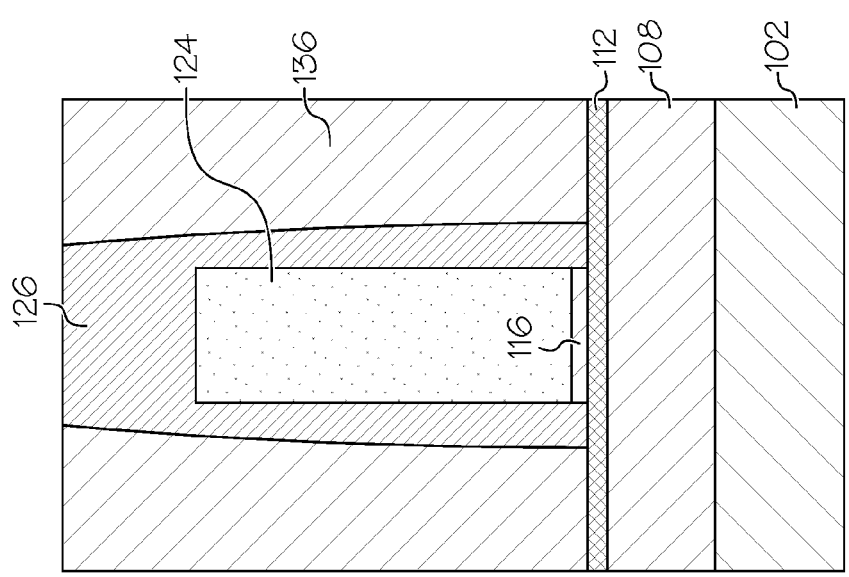
FIG. 18 is a semiconductor structure as viewed along line Y-Y' of FIG. 1, after subsequent processing steps of depositing a second layer of ILD.

FIGS. 17-19 show views of a semiconductor structure after depositing a second interlayer dielectric (ILD) 136. FIG. 17 is a semiconductor structure as viewed along line X-X' of FIG. 1, after subsequent processing steps of depositing a second inter-layer dielectric 136. FIG. 18 is a semiconductor structure as viewed along line Y-Y' of FIG. 1, after subsequent processing steps of depositing a second inter-layer dielectric 136. FIG. 19 is a semiconductor structure as viewed along line Z-Z' of FIG. 1, after subsequent processing steps of depositing a second inter-layer dielectric 136.

Figure 20:
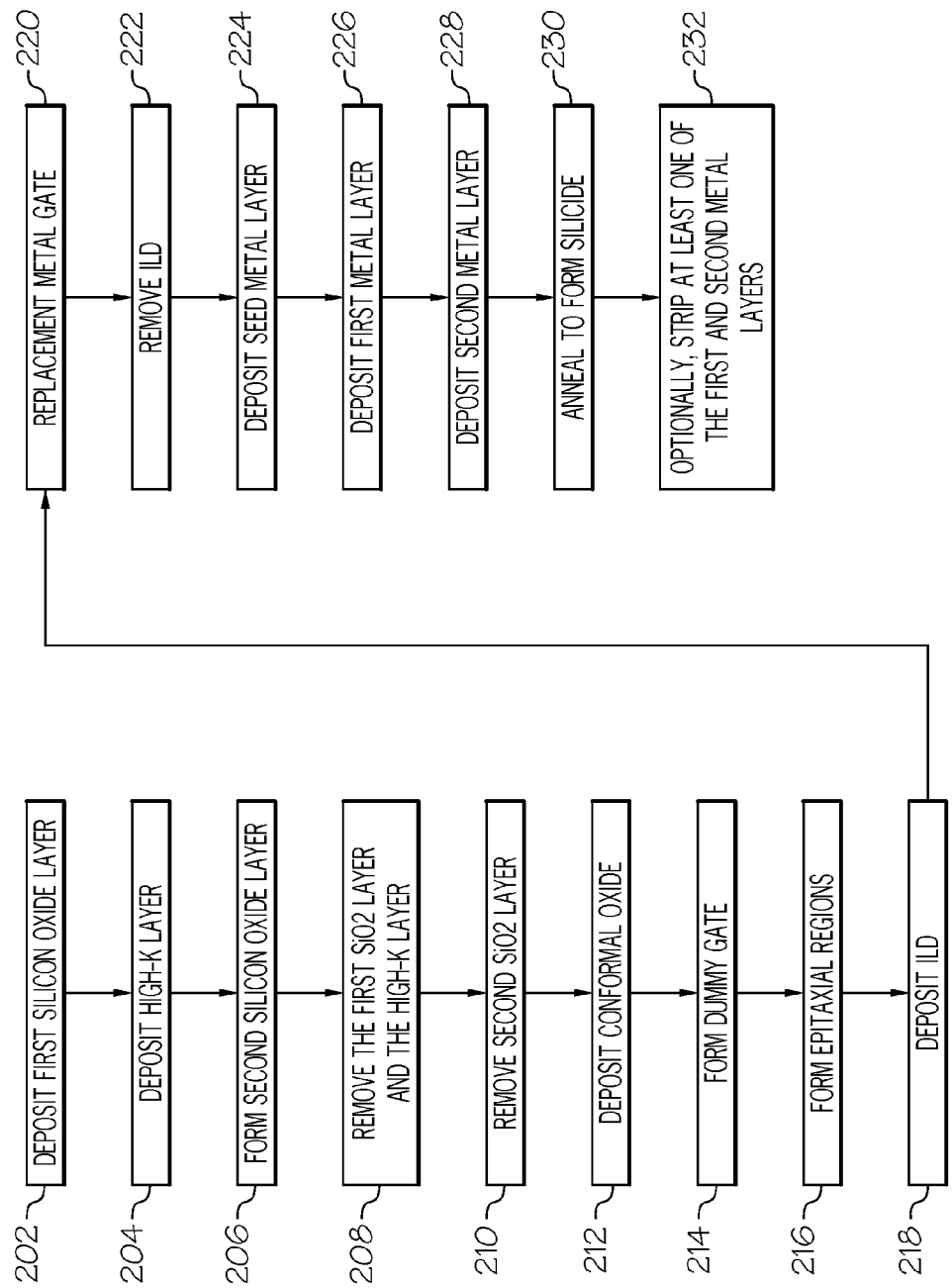
FIG. 20 is a flowchart indicating process steps for embodiments of the present invention.

FIG. 20 is a flowchart of a method according to exemplary embodiments of the present invention. At 202, a first silicon oxide layer is deposited over the silicon substrate. At 204, a high-K layer is deposited over the first silicon oxide layer by a horizontal deposition process. At 206, a second silicon oxide layer is formed over the high-K layer. At 208, the first silicon oxide layer and high-K layer are removed from over the fins of the finFET. At 210, the second silicon oxide layer is removed. At 212, a conformal oxide layer is deposited. At 214, a dummy gate is formed. At 216, gate spacers are formed. At 216, epitaxial regions are formed on the fins. At 218, an ILD is deposited. At 220, a replacement metal gate process is performed. At 222, the ILD is removed. At 224, a noble seed metal layer is deposited and grown. At 226, a first metal layer is deposited over the seed layer. At 228, a second metal layer is deposited over the epitaxial regions. Typically, the material used in step 228 is a similar material to that used in step 226. For example, if nickel is used in step 226, then nickel may also be used in step 228, even though the deposition processes are different for those two steps. At 230, annealing is performed to form silicide. At 232, optionally, at least one of seed metal layer, the first metal layer, and second metal layer is removed.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method of forming a semiconductor structure, comprising:

forming a plurality of silicon fins on a silicon substrate;
depositing a high-K dielectric layer on the silicon substrate adjacent to each fin of the plurality of fins;

forming at least one epitaxially grown silicon region on an upper portion of each fin of the plurality of fins, wherein the plurality of fins are unmerged;

depositing a seed metal layer on the high-K dielectric layer;

depositing an interspacing fill metal on the seed metal layer and on the at least one epitaxially grown silicon region; and forming a silicide of the interspacing fill metal on the at least one epitaxially grown silicon regions.

2. The method of claim 1, wherein the high-K dielectric layer comprises HfO2.

3. The method of claim 1, wherein the high-K dielectric layer comprises ZrO2.

4. The method of claim 1, wherein the seed metal layer comprises platinum.

5. The method of claim 1, wherein the seed metal layer comprises ruthenium.

6. The method of claim 1, wherein the interspacing fill metal comprises nickel.

7. The method of claim 1, wherein the interspacing fill metal comprises tungsten.

8. The method of claim 1, wherein the depositing a seed metal layer comprises depositing a seed metal layer using a selective deposition process.

9. The method of claim 8, wherein the depositing a seed metal layer comprises depositing via an atomic layer deposition process.

10. The method of claim 1, further comprising removing the interspacing fill metal after the silicide formation.

11. The method of claim 10, wherein the removing the interspacing fill metal comprises performing etch with aqua regia.

12. The method of claim 1, wherein the depositing an interspacing fill metal on the seed metal layer is performed via chemical vapor deposition.

13. The method of claim 1, wherein the depositing the interspacing fill metal on the epitaxially grown silicon regions is performed via physical vapor deposition.

14. A method of forming a semiconductor structure, comprising:

forming a plurality of silicon fins on a silicon substrate;

depositing a high-K dielectric layer on the substrate adjacent to each fin of the plurality of fins;

forming at least one epitaxially grown silicon region on an upper portion of each fin of the plurality of fins, wherein the plurality of fins are unmerged;

forming a metal gate on the silicon substrate;

depositing a seed metal layer on the high-K dielectric layer;

depositing an interspacing fill metal on the seed metal layer;

depositing a metal layer comprised of the interspacing fill metal on the at least one epitaxially grown silicon region; and forming a silicide of the interspacing fill metal on the at least one epitaxially grown silicon region.

15. The method of claim 14, wherein the seed metal layer comprises a noble metal.

16. The method of claim 14, wherein the interspacing fill metal comprises a metal selected from the group consisting of nickel and titanium.

\* \* \* \* \*